United States Patent [19]
Ker et al.

[11] Patent Number: 5,182,220
[45] Date of Patent: Jan. 26, 1993

[54] CMOS ON-CHIP ESD PROTECTION CIRCUIT AND SEMICONDUCTOR STRUCTURE

[75] Inventors: Ming-Dou Ker; Chung-Yuan Lee; Chung-Yu Wu, all of Hsinchu, Taiwan

[73] Assignee: United Microelectronics Corporation, Hsinchu, Taiwan

[21] Appl. No.: 863,693

[22] Filed: Apr. 2, 1992

[51] Int. Cl.[5] .......................................... H01L 21/265
[52] U.S. Cl. .................................... 437/34; 257/360; 257/141; 257/133
[58] Field of Search ................. 437/34; 357/23.13, 38, 357/92

[56] References Cited

U.S. PATENT DOCUMENTS

| | | | |
|---|---|---|---|
| 4,631,567 | 12/1986 | Kokado et al. | 357/23.13 |
| 5,012,317 | 4/1991 | Roontre | 357/43 |
| 5,086,242 | 2/1992 | Heidman et al. | 357/38 |

OTHER PUBLICATIONS

Chatterjee et al., 1990 Symposium on VLSI Techn., IEEE (1990), pp. 75-76.
Rountree, IEDM (1988), pp. 580-583.

Primary Examiner—Olik Chaudhuri
Assistant Examiner—H. Jey Tsai
Attorney, Agent, or Firm—George O. Saile

[57] ABSTRACT

A circuit for protecting a CMOS chip against damage from electrostatic discharges (ESD) has four SCRs connected between the line to be protected and the two power supply termiamls, $V_{DD}$ and $V_{SS}$. The SCRs are poled to conduct ESD current of either polarity to each power supply terminal. The bipolar transistors for the SCRs and the associated component are arranged in the chip in an advantageous way that reduces the input/output parasitic capacitance and improves the protection capability of this proposed circuit with a low ESD trigger-on voltage.

14 Claims, 3 Drawing Sheets

CMOS ON-CHIP ESD PROTECTION CIRCUIT AND SEMICONDUCTOR STRUCTURE

FIELD OF THE INVENTION

This invention relates to a circuit for protecting other circuits from excessive voltages. The invention also relates to a semiconductor device that embodies the protection circuit and also carries the components that are to be protected.

A RELATED APPLICATION

This specification is related to U.S. Pat. No. 5,140,401 of M. D. Ker et al. entitled "CMO ESD Protection Circuit with Parasitic SCR Structures", filed Mar. 25, 1991 and assigned to the assignee of this invention.

INTRODUCTION

The pads that interconnect a semiconductor chip with external circuits are commonly provided with protection circuits that turn on when an excessive voltage appears at a pad. The line that connects a pad to the protected circuits will be called the protected line. The protection circuits prevent the voltage from rising high enough to damage circuits that are connected to the pad. These circuits protect for example buffer circuits at an input pad and driver circuits at an output pad. The excessive voltages are commonly caused by an electrostatic discharge (ESD).

The related application describes CMOS device with a protection circuit that has silicon controlled rectifiers (SCRs). An SCR is connected between the protected line and each terminal of the power supply, $V_{DD}$ and $V_{SS}$.

An SCR has a PNP bipolar transistor and an NPN bipolar transistor that are interconnected so that the emitter-collector circuit of each transistor conducts the base current for the other. When either transistor is turned on, it turns on the other and both stay on until the current is interrupted. In the circuit of the related invention, an FET is connected to turn on one of the bipolar transistors when an excessive voltage appears on the protected line. Its source and drain terminals are connected to conduct in parallel with the emitter-collector circuit of one of the bipolar transistors and its source and gate terminals are connected between the line to be protected and one of the power supply terminals ($V_{DD}$ or $V_{SS}$), which forms a sink for the ESD current and also provides an extra triggering current to enhance the turn-on speed of the SCRs.

SCRs have several advantages: they can handle high current, they have a low turn-on impedance, they dissipate low power, and they have a large volume for heat dissipation. However because SCRs use bipolar transistors, they have been difficult to implement in CMOS technologies: they usually have a high turn-on voltage, which may be in the range that the circuits should protect against, but the turn-on voltage can be lowered by ESD transiently triggering with the proper circuit design on the device capacitances.

SUMMARY OF THE INVENTION

As in the related invention, the power supply terminals form sinks for the ESD current and also form voltage references for turning on the SCRs. One object of this invention is to provide an SCR protection circuit for each of the four combinations of ESD current polarity and power supply reference voltage. One SCR conducts positive ESD currents to $V_{SS}$ (as in the related invention), one conducts positive ESD currents to $V_{DD}$, one conducts negative ESD currents to $V_{SS}$ and one conducts negative ESD currents to $V_{DD}$ (as in the related invention).

Another object is to provide an improved semiconductor structure and an associated manufacturing process for making these components small and thereby reducing selected capacitances of the circuit. When certain capacitances are made smaller, the circuit can turn on at a lower ESD voltage.

The preferred semiconductor structure has an improved organization that permits the power supply terminals, $V_{SS}$ and $V_{DD}$, to be physically spaced apart on the chip, on opposite sides of the chip area designated for the protection circuit.

THE DRAWING

THE CIRCUIT—FIG. 1

Figure 1:
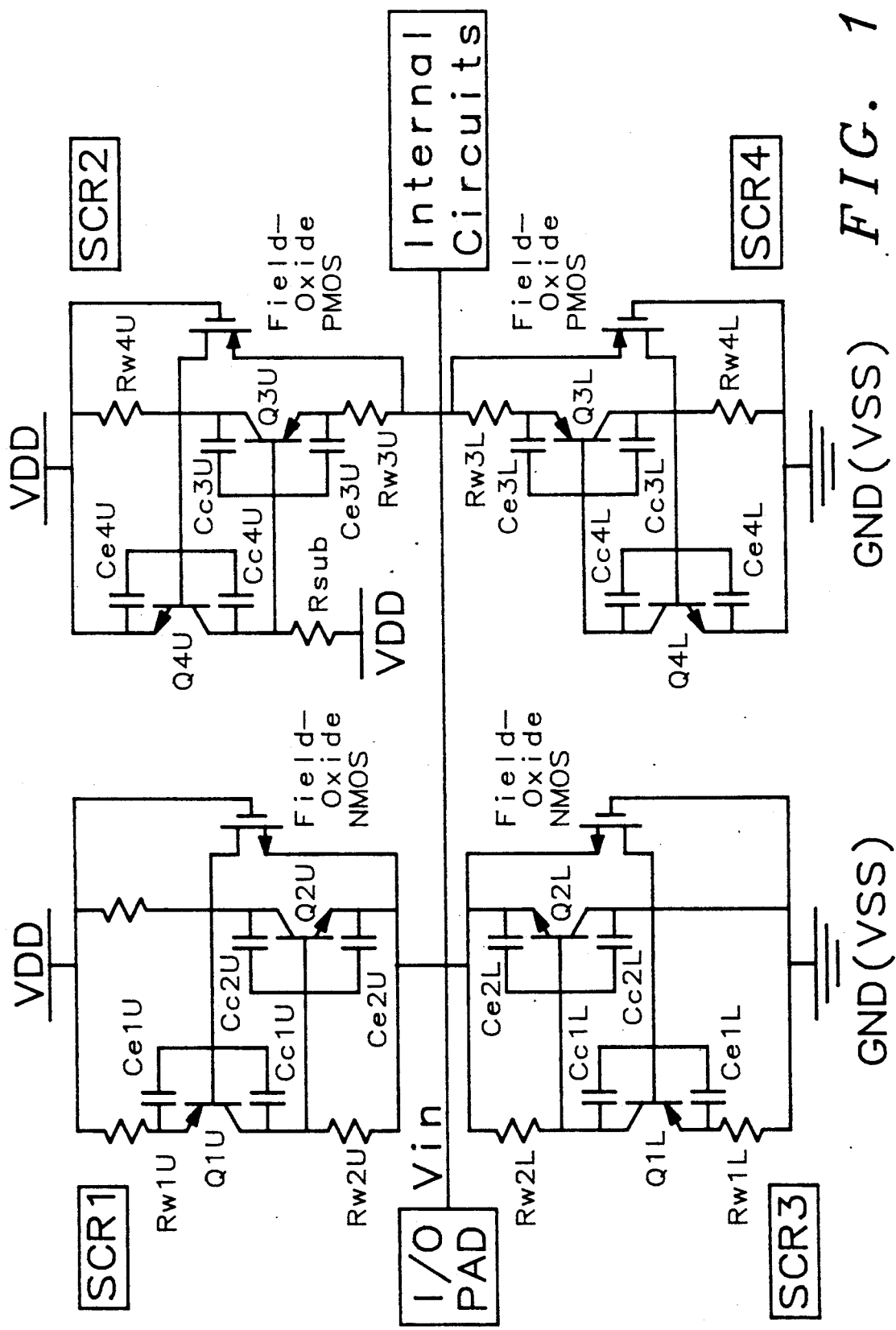
FIG. 1 is a schematic drawing of the protection circuit of this invention.

The protection circuit protects circuits on the same chip and these circuits are shown for generality as a box "Internal Circuits". A protected line connects the internal circuits to an I/O pad where the internal circuits receive a signal Vin and where an ESD pulse can appear.

The protection circuit has four SCR circuits that are identified in the drawing as SCR1, SCR2, SCR3 and SCR4. SCR1 is similar to the upper SCR circuit in the related application, and it can be understood easily from a description of its operation.

SCR1

When the protected line receives a negative ESD pulse, SCR1 conducts the associated current to the positive terminal of the power supply, $V_{DD}$. The power supply terminals act as a sink for the ESD current, and (as will be explained) they also act as voltage references for turning on the SCRs.

The circuit path for this ESD current can be traced from $V_{DD}$ to $V_{SS}$ in separate paths through the two bipolar transistors that form this SCR, PNP transistor Q1u and NPN transistor Q2u (u for upper). (To look ahead in this description, Q1u is formed as a lateral transistor and Q2u is formed as a vertical transistor.) The path through Q1u comprises an emitter resistor Rw1u, the emitter-collector circuit of Q1u, and a collector resistor Rw2u The path through Q2u comprises a collector resistor Rsub and the collector-emitter circuit of Q2u. When Q1u conducts, the voltage drop across its collector resistor Rw2u appears at the base terminal of transistor Q2u and turns on Q2u. When Q2u conducts, the voltage drop across its collector resistor Rsub appears at the base terminal of transistor Q1u and turns on Q1u.

Figure 3:
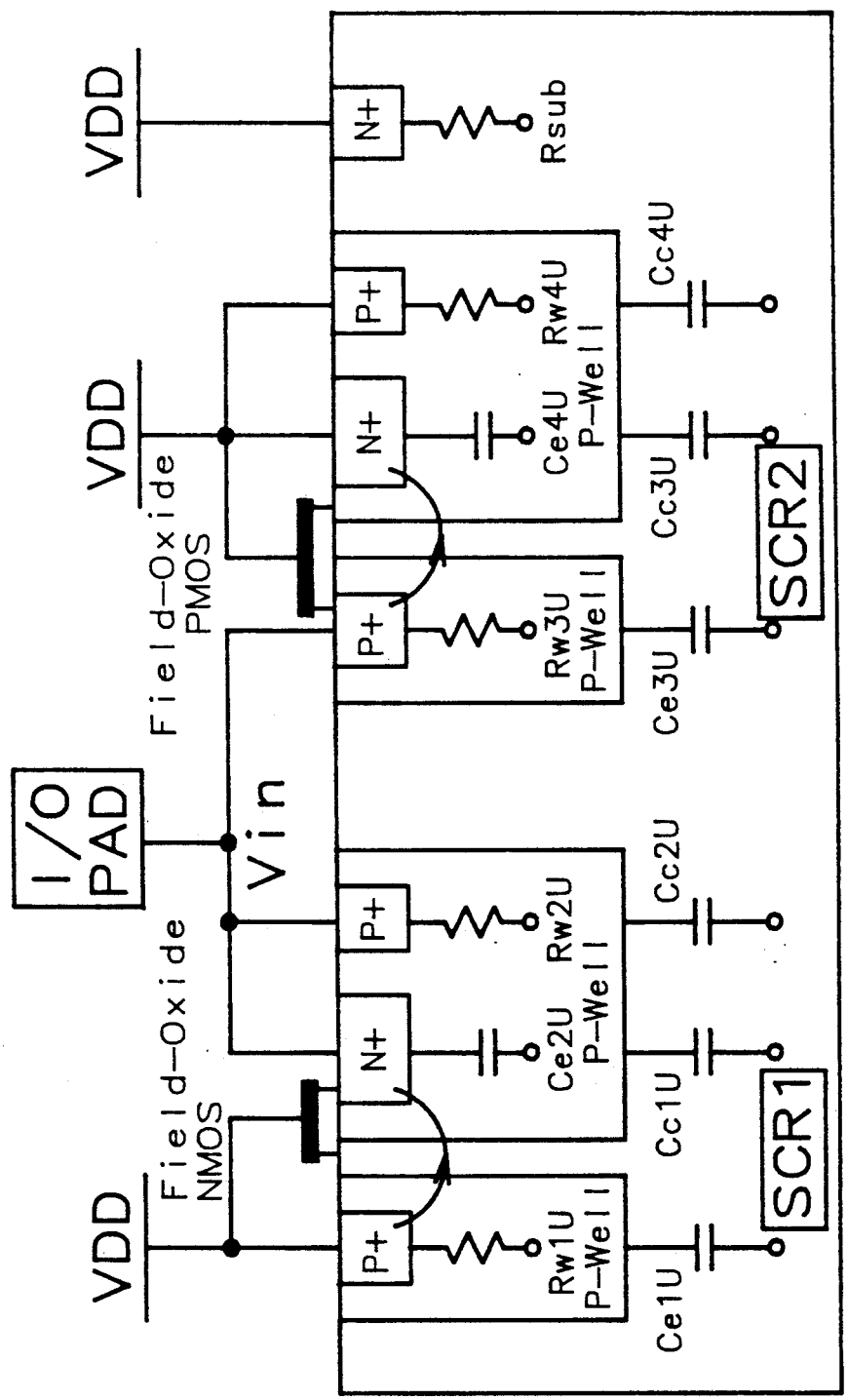
FIG. 3 is a section view of the preferred structure.

The capacitances shown schematically in FIG. 1 are also shown in FIG. 3 and will be discussed later.

A field-oxide n-channel FET has its source terminal connected to the emitter terminal of transistor Q2u and its drain terminal connected to the collector terminal of transistor Q2u, and when the FET turns on, it turns on transistor Q1u in the way that has already been described for transistor Q2u. The gate terminal of the FET is connected to $V_{DD}$ so that the FET turns on when the protected line Vin has a predetermined negative voltage with respect to $V_{DD}$.

SCR2

This SCR is connected between $V_{DD}$ and the protected line (like SCR1) and it turns on to protect the internal circuits when an ESD pulse on the protected line reaches a predetermined positive voltage with respect to $V_{DD}$ (unlike SCR1). Power supplies commonly have diodes that are poled in a direction to carry this current. NPN transistor Q4u has its emitter connected to $V_{DD}$ and its collector connected to the base of PNP transistor Q3u. A resistor Rw4u connects the collector of Q3u to $V_{DD}$ and a resistor Rw3u connects the emitter of Q3u to the protected line. A field-oxide p-channel FET has its source and drain terminals connected to conduct in parallel with the emitter-collector circuit of Q3u and its gate terminal connected to $V_{DD}$ to turn on when the protected line reaches a selected negative voltage with respect to $V_{DD}$.

SCR3 and SCR4

These SCRs are connected between the protected line and ground ($V_{SS}$). SCR3 is similar to SCR1 and it turns on when the protected line reaches a selected negative voltage with respect to $V_{SS}$. SCR4 is similar to SCR2 and turns on when the protected line reaches a selected positive voltage with respect to $V_{SS}$.

THE STRUCTURE AND METHOD OF MANUFACTURE—FIGS. 2 AND 3

Note that the structure in the left part of the diagram forms SCR1 and the structure to the right forms SCR2. These two SCR structures have significant similarities and significant differences. An N+ region to the right in the drawing forms a connection to $V_{DD}$ as the substrate-bias In the drawing for each SCR, an arrow shown from a P+ diffusion to an N+ diffusion represents the principal path for ESD currents. In SCR1 this path is from $V_{DD}$ to the I/O pad and marks as PNP transistor Q1u and NPN transistor Q2u; in SCR2 this path is from the I/O pad to $V_{DD}$ and marks as PNP transistor Q3u and NPN transistor Q4u.

The arrowed line also connects the anode and cathode of the SCR. The dc trigger voltage can be reduced by reducing the space between the anode and cathode. The arrangement of the components in the semiconductor structure permits this distance to be made small. Table I, presented later, shows the effect of different spacing.

The device has an N-substrate and each SCR has two p-wells, which will be referred to as left and right in the description for each SCR. The details of the structure can be understood easily by comparing the semiconductor areas in FIG. 3 with the corresponding nodes in the circuit diagram of FIG. 1.

The field-oxide NMOS transistor

The gate and the underlying insulator of this transistor can be seen on the upper surface of the device. The oxide overlies a portion of the right p-well that forms the FET channel. An N+ diffusion in the right p-well forms the source of the FET; it is connected to $V_{DD}$ by wiring on the upper surface of the device. The portion of the N-substrate region between the two p-wells forms the drain.

The vertical NPN transistor Q2u

In FIG. 1, the source of the FET is connected to the emitter of NPN transistor Q2u, and in FIG. 3 the N+ diffusion that forms the source of the FET also forms the emitter of Q2u. The underlying region of the p-well forms the base, and the underlying N-substrate forms the collector. The collector is connected to $V_{DD}$, on the right of the structure, through the N-substrate, and the resistance of this path is shown as a schematic resistor, Rsub. Note that Q2u is a vertical transistor.

The lateral PNP transistor Q1u

Q1u is a lateral bipolar transistor, and its components can be understood in the sequence of the arrow in the drawing: the P+ region forms the connection to the power supply $V_{DD}$, p-well forms the emitter, the nearby region of the N-substrate forms the base, the right p-well which forms the collector, and the N+ diffusion in the right p-well makes the connection to the I/O pad. The path through the left P-well forms the emitter resistor Rw1u.

SCR1

The p-well region that forms the base of Q2u also forms the collector region of Q1u, and the intervening N-substrate region forms the collector of Q2u forms the base of Q1u. The nearby region of the left p-well forms the collector of Q1u. A P+ diffusion in the left p-well provides a connection to $V_{DD}$ at the surface of the device, and the current path through the p-well to $V_{DD}$ forms the emitter resistor Rw1u. A P+ diffusion in the right p-well forms a connection to Vin, and the current path from the emitter to the left and the connection to Vin on the right forms the resistor Rw2u (which isolates the base of Q2u from Vin).

The capacitances shown in FIG. 3 affect the speed of turning on the SCR in response to a transient ESD event (in contrast to the dc triggering that has been discussed earlier). Specifically, the trigger voltage is lowered when the capacitance Cc1+Cc2 is increased with respect to the capacitances Ce1 and Ce2.

SCR2

The arrowed path in the right side of FIG. 3 is drawn over the lateral PNP transistor Q3u and the vertical NPN transistor Q4u. The left p-well forms the emitter, the right p-well forms the collector, and the intervening region of N-substrate forms the base of Q3u. The path from the P+ diffusion in the left p-well and I/O pad to the emitter region forms resistor Rw3u, and the path from the collector through the right p-well to forms resistor Rw4u. The left p-well forms the source region of the field-oxide PMOS FET, the right p-well forms the drain region, and the N-substrate forms the channel.

The N+ diffusion in the right p-well forms the emitter of the vertical NPN transistor Q4u, the underlying region of the p-well (which forms the collector of the PNP transistor Q3u) forms the base, and the N-substrate forms the collector. The path from the collector through the substrate to the N+ diffusion for $V_{DD}$ forms resistor Rsub. (This path is due to the inherent substrate-bias of CMOS IC and is not shown for the similar circuit of SCR4.)

The N-substrate forms the channel of the field-oxide PMOS FET, the left p-well forms its source, and the right p-well forms the drain.

The Structure and Method of Manufacture for SCRs 3 and 4

Figure 2:
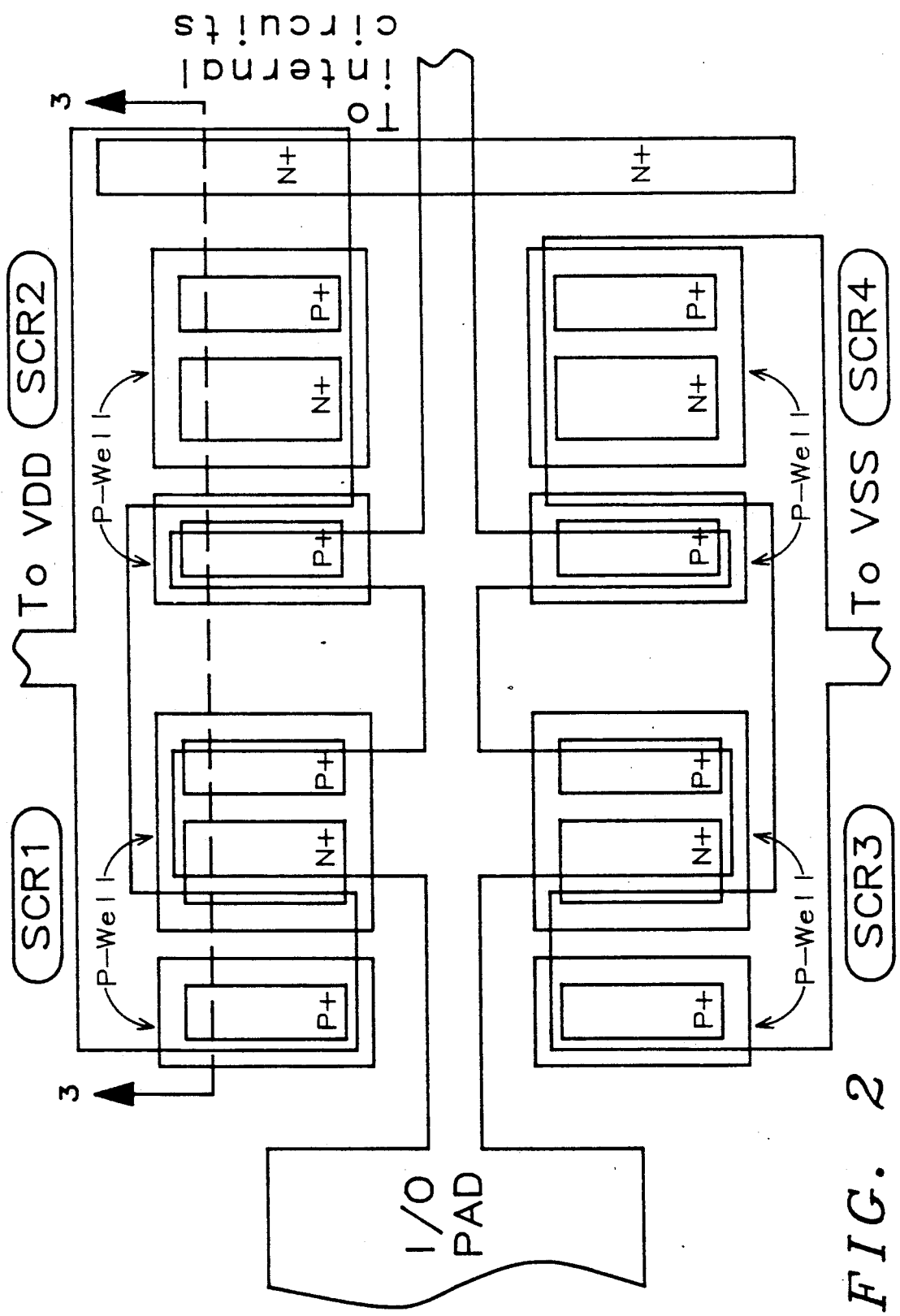
FIG. 2 is a plan view of the preferred semiconductor structure.

In the top view of FIG. 2, the section line identifies the location of SCRs 1 and 2 which have just been described. SCRs 3 and 4 are symmetrically arranged, as will be understood from FIG. 2. They are identical to FIG. 3 in section except that the connections that are made to $V_{DD}$ in FIG. 3 are made to $V_{ss}$, as FIG. 2 shows.

Note in FIG. 2 that the I/O pad is on the left and the internal circuits are on the right and that the protection circuits are located on opposite sides of the input line (as with a different protection circuit in the related application). Note that advantageously that the circuit has one conductor for $V_{DD}$ located on one side of the structure and one conductor for $V_{SS}$ located on the opposite side of the structure.

Table I shows test results with this circuit. The column headings show different sizes of SCR1, SCR2, SCR3 or SCR4. Some of the row headings identify the tests. The bottom row shows the dc turn-on voltage measured at the 1 micro ampere initial current, and the next to the last row shows the minimum anode to cathode spacing (the space between the diffusions connected by the arrowed line in FIG. 3).

TABLE I

| | | Layout area of the fabricated lateral SCR structures (width × length, unit: $\mu m \times \mu m$) | | | | |
|---|---|---|---|---|---|---|
| | | 58 × 25 | 58 × 50 | 58 × 100 | 75 × 100 | 134 × 100 |
| ESD Failure threshold Voltage | Machine mode (MM) | 100V | 600V | >1000V* | >1000V* | >1000V* |
| | Human body mode (HBM) | 1600V | 6000V | >10KV* | >10KV* | >10KV* |
| Triggering-on Voltage | DC condition | 17.93V | 17.72V | 16.28V | 18.14V | 17.28V |
| | AC pulse-type condition | 14.70V | 14.78V | 13.62V | 15.38V | 15.26V |
| The minimum anode to cathode space | | 6 $\mu m$ | 6 $\mu m$ | 6 $\mu m$ | 9 $\mu m$ | 9 $\mu m$ |
| V on (1 $\mu A$)# | | 11.58V | 10.36V | 9.76V | 9.44V | 9.80V |

*limited by the ESD testing equipment.
The dc turn-on voltage measured at the 1 $\mu A$ initially conducting current.

OTHER EMBODIMENTS

Those skilled in the art will recognize variations in the circuit and structure that have been described, within the spirit of the invention and the intended scope of the claims. For example it can also be implemented by the n-well/p-substrate process as well if the appropriate changes in the protective structures are made.

We claim:

1. Method of simultaneously fabricating an on-chip silicon controlled rectifier protection circuit against electrostatic discharge pulses for highly dense CMOS integrated circuits as the CMOS integrated circuits are formed comprising:
   providing an area in an N type monocrystalline silicon substrate of said integrated circuit designated for said protection circuit;
   forming P type wells in said designated area wherein at least one pair of P type wells are closely positioned;
   forming a P+ anode region in one of said at least one pair of P type wells;
   forming an N+ cathode region and a P+ region within the other of said at least one pair of P type wells, whereby a silicon controlled rectifier device is formed; forming a gate dielectric and electrode on the surface of said monocrystalline silicon and closely associated with said at least one pair of P type wells, whereby a field oxide MOS device is formed; and
   forming electrical connections to form said protection circuit to supply voltage, ground, input/output signal source and said highly dense CMOS circuit.

2. The method of claim 1 wherein dual silicon controlled rectifier protection circuits are formed within said designated area wherein two pair of P type wells are formed in said designated area and further comprising forming an N+ region in said silicon substrate and connected said N+ region to said supply voltage whereby the said CMOS circuits are protected against positive and negative electrostatic discharge pulses.

3. The method of claim 1 wherein a full silicon controlled electrostatic discharge protection circuit is formed in said designated area wherein four pairs of P+ wells are formed and further comprising forming an N+ region in said silicon substrate and connecting said N+ region to said supply voltage wherein the said CMOS circuits are protected against positive and negative electrostatic discharge pulses from input/output source to supply voltage and from input/output source to ground.

4. The method of claim 1 wherein said total spacing between said anode and cathode is less than about 6 micrometers.

5. The method of claim 4 wherein said spacing between said N+ cathode to edge of said P well is less than about 2 micrometers and the spacing between said P+ anode to edge of said P well is less than about 2 micrometers.

6. The method of claim 1 and further comprising forming an N well between said at least one pair of P wells and wherein said doping concentration of the said P wells is between about $7 \times 10^{15}$ and $1 \times 10^{16}$ atoms per $cm^3$ and said N well is between about 1 to $3 \times 10^{16}$ atoms per $cm^3$.

7. The method of claim 6 wherein said total spacing between said anode and cathode is less than about 6 micrometers.

8. The method of claim 7 wherein said spacing between said N+ cathode to edge of said P well is less than about 2 micrometers and the spacing between said P+ anode to edge of said P well is less than about 2 micrometers.

9. Method of simultaneously fabricating an on-chip silicon controlled rectifier protection circuit against electrostatic discharge pulses for highly dense CMOS integrated circuits as the CMOS integrated circuits are formed comprising:

providing an area in an N type monocrystalline silicon substrate of said integrated circuit designated for said protection circuit;

forming four pairs of P type wells in said designated area wherein said pairs of P type wells are closely positioned;

forming P+ anode regions in one of said pairs of P type wells;

forming N+ cathode region and P+ region within the other of said pair of P type wells, whereby a silicon controlled rectifier device is formed;

forming a NMOS gate dielectric and electrode on the surface of said monocrystalline silicon and closely associated with two of said pair of P type wells and a PMOS gate dielectric and electrode on the surface of said monocrystalline silicon and closely associated with the other two of said pair of P type wells, whereby two field oxide MOS devices are formed;

forming an N+ region in said silicon substrate and connecting said N+ region to the supply voltage; and forming electrical connections to form said protection circuit by connecting two of said circuits to supply voltage, the other two of said circuits to ground, and connecting all four of said circuits to the input/output signal source and said highly dense CMOS circuit wherein the said CMOS circuits are protected against positive and negative electrostatic discharge pulses from input/output source to supply voltage and from input/output source to ground.

10. The method of claim 9 wherein said total spacing between said anode and cathode is less than about 6 micrometers.

11. The method of claim 10 wherein said spacing between said N+ cathode to edge of said P well is less than about 2 micrometers and the spacing between said P+ anode to edge of said P well is less than about 2 micrometers.

12. The method of claim 9 and further comprising forming an N well between said at least one pair of P wells and wherein said 3 doping concentration of the said P wells is between about $7 \times 10^{15}$ and $1 \times 10^{16}$ atoms per cm$^3$ and said N well is between about 1 to $3 \times 10^{16}$ atoms per cm$^3$.

13. The method of claim 12 wherein said total spacing between said anode and cathode is less than about 6 micrometers.

14. The method of claim 13 wherein said spacing between said N+ cathode to edge of said P well is less than about 2 micrometers and the spacing between said P+ anode to edge of said P well is less than about 2 micrometers.

* * * * *